(12) United States Patent
Chen et al.

(10) Patent No.: US 9,859,273 B2
(45) Date of Patent: Jan. 2, 2018

(54) SEMICONDUCTOR STRUCTURE AND MANUFACTURING PROCESS THEREOF

(71) Applicant: TAIWAN SEMICONDUCTOR MANUFACTURING CO., LTD., Hsinchu (TW)

(72) Inventors: Yi-Jen Chen, Hsinchu (TW); Chun-Sheng Liang, Puyan Township (TW); Shu-Hui Wang, Hsinchu (TW); Shih-Hsun Chang, Hsinchu (TW); Hsin-Che Chiang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/724,676

(22) Filed: May 28, 2015

(65) Prior Publication Data

US 2016/0351563 A1 Dec. 1, 2016

(51) Int. Cl.
| | | |
|---|---|---|
| *H01L 27/088* | (2006.01) | |
| *H01L 29/06* | (2006.01) | |
| *H01L 29/49* | (2006.01) | |
| *H01L 29/51* | (2006.01) | |
| *H01L 29/423* | (2006.01) | |
| *H01L 21/8234* | (2006.01) | |
| *H01L 21/02* | (2006.01) | |
| *H01L 21/762* | (2006.01) | |
| *H01L 21/311* | (2006.01) | |

(52) U.S. Cl.
CPC ........ *H01L 27/088* (2013.01); *H01L 21/0217* (2013.01); *H01L 21/02126* (2013.01); *H01L 21/02164* (2013.01); *H01L 21/02271* (2013.01); *H01L 21/31111* (2013.01); *H01L 21/76224* (2013.01); *H01L 21/823437* (2013.01); *H01L 21/823481* (2013.01); *H01L 29/0649* (2013.01); *H01L 29/42372* (2013.01); *H01L 29/4958* (2013.01); *H01L 29/4966* (2013.01); *H01L 29/517* (2013.01); *H01L 29/518* (2013.01)

(58) Field of Classification Search
USPC ............. 257/369, E27.062, E21.19; 438/592
See application file for complete search history.

(56) References Cited

U.S. PATENT DOCUMENTS

2013/0105903 A1* 5/2013 Chang ............. H01L 21/823842
257/369

* cited by examiner

*Primary Examiner* — Hrayr A Sayadian
(74) *Attorney, Agent, or Firm* — Maschoff Brennan

(57) ABSTRACT

A process of manufacturing a semiconductor structure is provided. The process begins with forming a work function metal layer on a substrate, and a hardmask is covered over the work function metal layer. A trench is formed to penetrate the hardmask and the work function metal layer, and an isolation structure is filled in the trench.

20 Claims, 12 Drawing Sheets

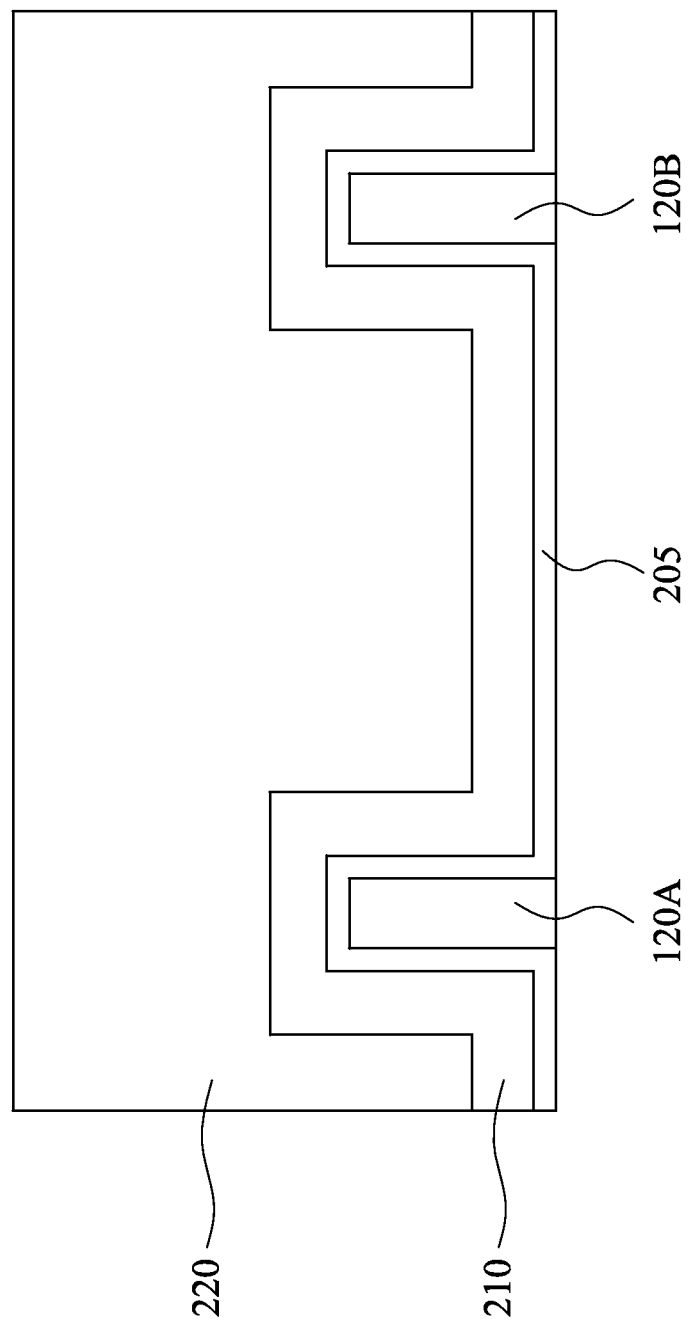

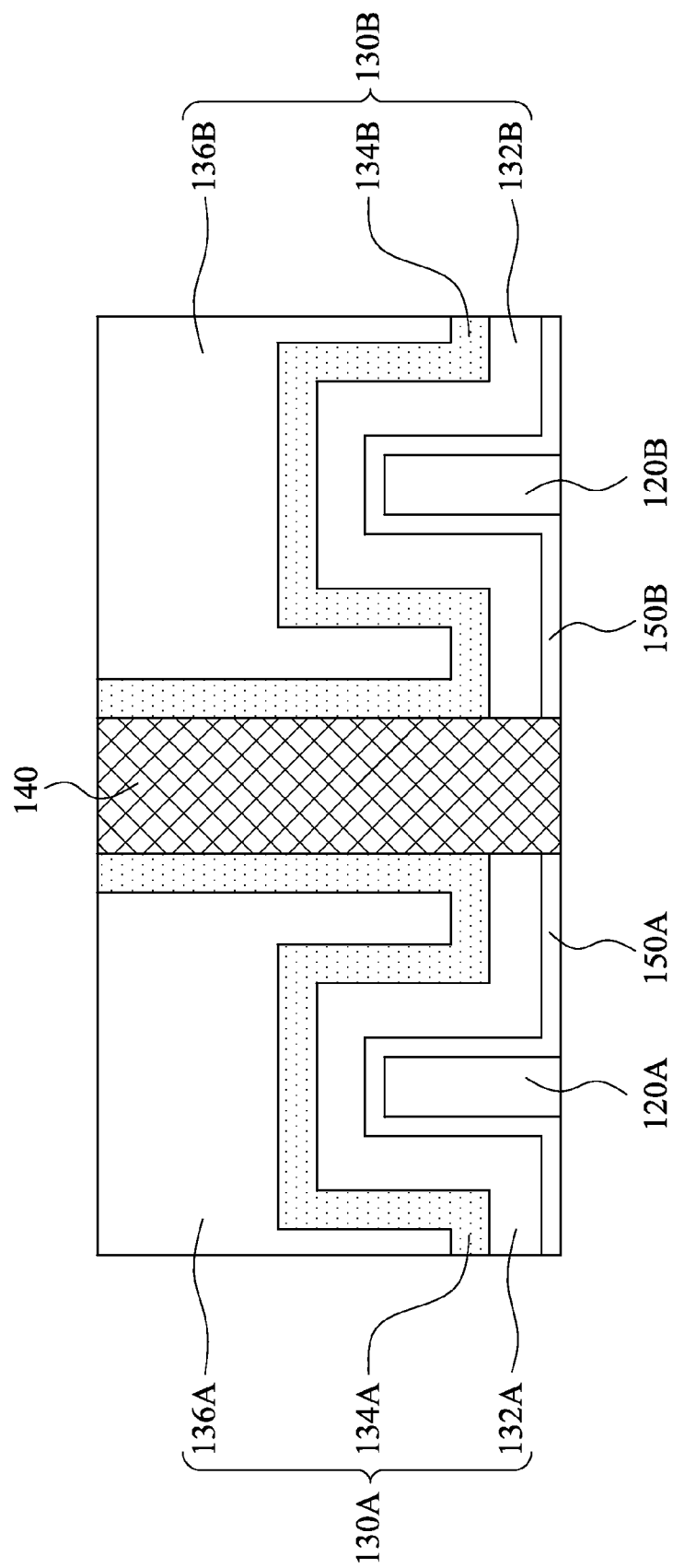

SEMICONDUCTOR STRUCTURE AND MANUFACTURING PROCESS THEREOF

BACKGROUND

Manufacturing of an integrated circuit (IC) has been largely driven by the need to increase the density of the integrated circuit formed in a semiconductor device. This is typically accomplished by implementing more aggressive design rules to allow larger density of IC device to be formed. Nonetheless, the increased density of the IC devices, such as transistors, has also increased the complexity of processing semiconductor devices with the decreased feature sizes.

Transistors in the integrated circuit have typically been formed with a silicon gate oxide and polysilicon gate electrode. There has been a desire to replace the silicon gate oxide and polysilicon gate electrode with a high-k gate dielectric and metal gate electrode to improve device performance as feature sizes continue to decrease. Transistor having metal gate electrode, especially in conjunction with high dielectric constant (high-k) dielectric, may address issues such as polysilicon depletion and gate leakage associated with silicon gate oxide. In addition, metal gate transistors exhibit a lower resistivity than doped polysilicon. In the manufacturing process of the metal gate transistors, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to 2I are cross-sectional views of the semiconductor structure in FIG. 1A along the line AA at an intermediate stage of fabrication, in accordance with various embodiments.

DETAILED DESCRIPTION

Figure 1A:
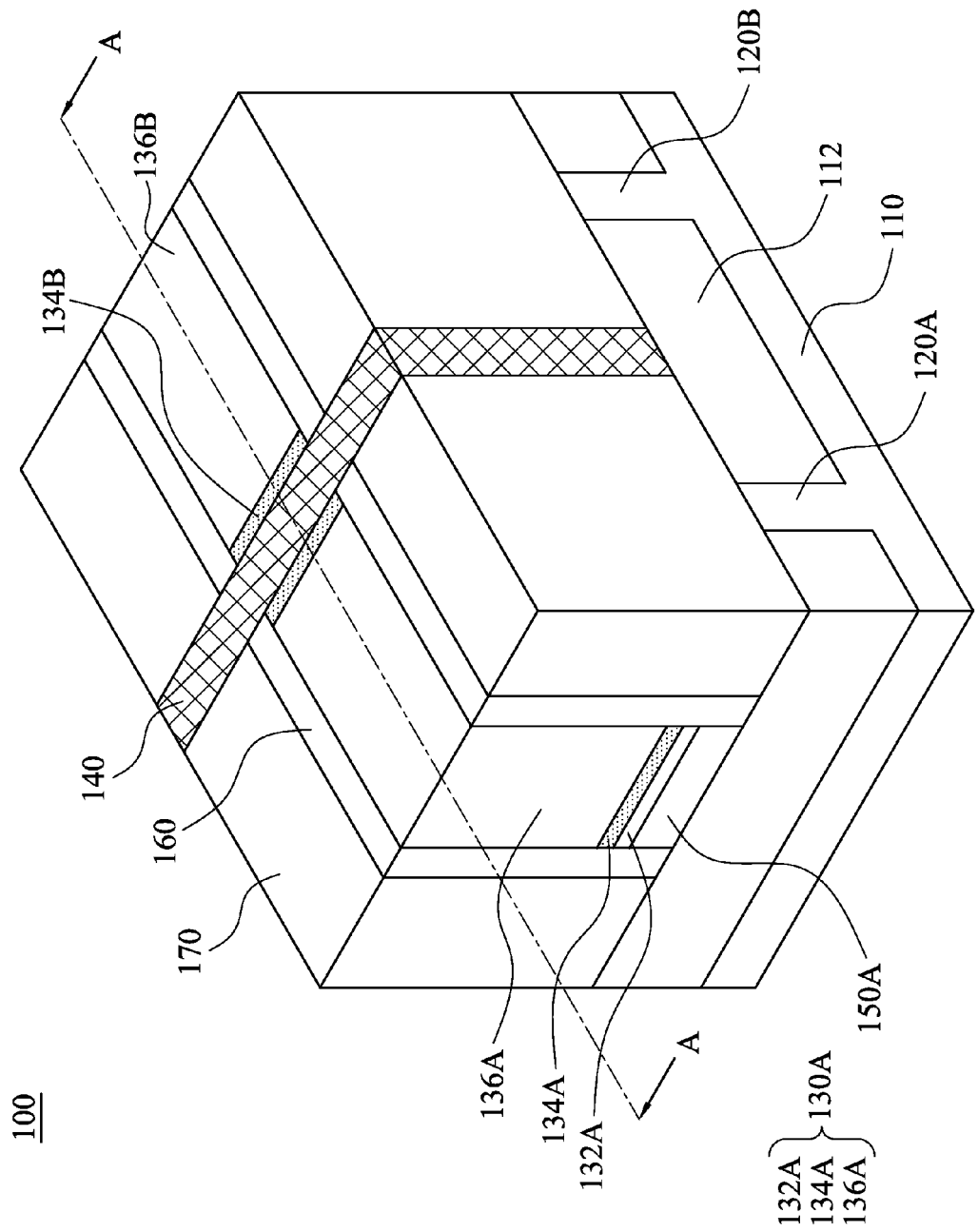
FIG. 1A is a semiconductor structure in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, a method of isolating adjacent gate structures includes following steps. A layer formed of silicon-based material is deposited over the devices, and a trench is formed to penetrate the layer. Then, an isolation structure is filled in the trench to separate two adjacent devices, and the layer is removed. After separating the two adjacent devices, a work function metal, a barrier and a metal gate are deposited to form a gate structure on each of the device. Because the isolation structure is formed before the work function metal, a portion of the work function metal will cover sidewalls of the isolation structure, which is also referred as an unwanted work function metal. However, a distance between the isolation structure and the device is too small, this unwanted work function metal may merge with the work function metal covered on the device, and thus induces insufficient space for metal gate formation. Specifically, the merged feature significantly reduces overlapped area between the device and the metal gate, which decreases the performance of the device.

Other method of isolating adjacent gate structures includes following steps. A work function layer, a barrier layer and a metal gate layer are sequentially form on the devices, and a trench is formed to penetrate the work function layer, the barrier layer and the metal gate layer. Then, an isolation structure is filled in the trench to separate the work function layer, the barrier layer and the metal gate layer, so as to form individual gate structures respectively on each of the device. However, it is difficult and challenging to control size and profile of the trench when penetrating the metal gate layer, and an inter-layer dielectric (ILD) layer adjacent to the trench is removed simultaneously. In this situation, a thickness of the ILD layer is reduced, which may cause height loss of the metal gate when performing the subsequence CMP process. Therefore, it is necessary to provide an improved process to isolate adjacent gate structures.

Figure 1B:
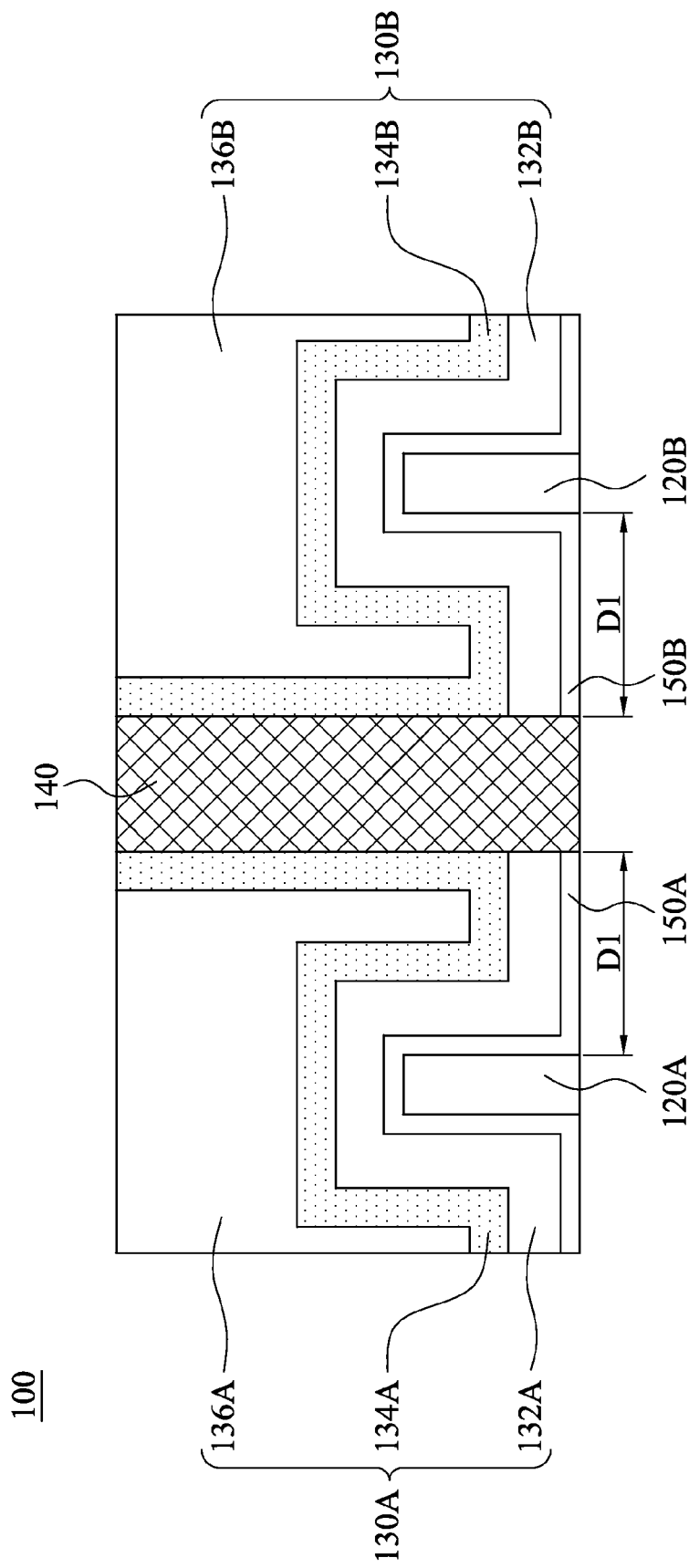
FIG. 1B is a cross-sectional view of the semiconductor structure in FIG. 1A along the line AA, in accordance with various embodiments.

FIG. 1A is a semiconductor structure in accordance with various embodiments of the present disclosure, and FIG. 1B is a cross-sectional view of the semiconductor structure in FIG. 1A along the line AA, in accordance with various embodiments. In FIG. 1A, a semiconductor structure 100 includes a substrate 110, a plurality of devices 120A and 120B, a plurality of gate structures 130A and 130B, and an isolation structure 140. The devices 120A and 120B having functionality in the semiconductor structure 100 are fabricated in the substrate 110, and the plurality of gate structures 130A and 130B are respectively disposed on the plurality of devices 120A and 120B. Besides, an isolation layer 112 separates the adjacent devices 120A and 120B. In some embodiments, the devices 120A and 120B are fin structures as shown in FIG. 1A, and the gate structures 130A and 130B are respectively disposed on the devices 120A and 120B and overlapped with sidewalls of the devices 120A and 120B. In various embodiments, the devices 120A and 120B are planar transistors.

The substrate 110 may be a bulk silicon substrate. In some embodiments, the substrate 110 may include an elementary semiconductor including silicon or germanium in crystal, polycrystalline, and/or an amorphous structure. In various embodiments, the substrate 110 may include a compound semiconductor, such as silicon carbide, gallium arsenic, gallium phosphide, indium phosphide, indium arsenide, and/or indium antimonide. In various embodiments, the substrate 110 may include an alloy semiconductor such as SiGe, GaAsP, AlInAs, AlGaAs, GaInAs, GaInP, and/or GaInAsP; any other suitable material; and/or combinations thereof. In various embodiments, the substrate is a silicon-on-insulator (SOI) substrate. The SOI substrate is fabricated using separation by implantation of oxygen (SIMOX), wafer bonding, and/or other suitable methods, and an exemplary insulator layer may be a buried oxide layer (BOX).

In some embodiments, the isolation layer 112 may be a single layer or a multi-layer structure. In various embodiments, the isolation layer 112 may be formed of silicon oxide, silicon nitride, silicon oxynitride, fluoride-doped silicate glass (FSG), a low-k dielectric material, and/or other suitable insulating materials.

In FIGS. 1A and 1B, the gate structures 130A includes a work function metal 132A on the device 120A, a barrier 134A on the work function metal 132A, and a metal gate 136A on the barrier 134A. Besides, a high-k dielectric 150A is interposed between the work function metal 132A and the device 120A. The high-k dielectric 150A and the gate structures 130A form a HK/MG (high-k/metal gate) stack on the device 120A. Similarly, the gate structures 130B includes a work function metal 132B on the device 120B, a barrier 134B on the work function metal 132B, and a metal gate 136B on the barrier 134B. Also, a high-k dielectric 150B is interposed between the work function metal 132B and the device 120B. The high-k dielectric 150A and 150B may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

The work function metals 132A and 132B are used to enhance electrical performance of the device 120A and 120B. In some embodiments, the work function metal 132A may includes an n-type work function metal, such as Ta, TiAl, TiAlN or TaCN, to produce suitable low threshold voltage for an n-type device. In various embodiments, the work function metal 132B may includes a p-type work function metal, such as TiN or TaN, to produce suitable low threshold voltage for a p-type device. The material of the barriers 134A and 134B, such as tantalum (Ta), titanium nitride (TiN), tantalum nitride (TaN), tungsten nitride (WN), titanium carbon nitride (TiCN), tantalum carbon nitride (TaCN), tungsten carbon nitride (WCN), combination thereof, or other suitable material is used to improve the adhesion between the metal gates 136A, 136B and the work function metals 132A, 132B. Also, barriers 134A and 134B are used to prevent metallic inter-diffusion between the work function metals 132A, 132B and the metal gates 136A, 136B. In various embodiments, the barriers 134A and 134B may be in the form of multiple layers. Besides, the metal gates 136A and 136B are in conjunction with the high-k dielectrics 150A and 150B to reduce issues such as polysilicon depletion and gate leakage. In addition, the metal gates 136A and 136B exhibits lower resistivities than a polysilicon gate. Examples of suitable materials for the metal gates 136A and 136B include but are not limited to aluminum, copper, titanium, tantalum, tungsten, molybdenum, platinum, or combination thereof. In various embodiments, the metal gates 136A and 136B are formed of tungsten.

The isolation structure 140 is disposed between the two adjacent ones of the gate structures 130A and 130B. In other words, the isolation structure 140 separates and electrically isolates the gate structures 130A and 130B. The isolation structure 140 may include silicon oxide, silicon nitride, spin-on glass, combination thereof, or other suitable material. Typically, an unwanted work function metal is covered on sidewalls of an isolation structure 140, which is difficult to be removed since a line-end distance D1 between the device 120A or 120B and the isolation structure 140 is too small. This unwanted work function metal induces insufficient space for forming the metal gate 136A and 136B, and thus causes electrical mismatch. In this regard, according to some embodiments, a process is provided to manufacture the semiconductor structure 100 without work function metals 132A and 132B covering on sidewalls of the isolation structure 140. In FIG. 1B, the work function metals 132A and 132B do not cover sidewalls of the isolation structure 140. Without the work function metals 132A and 132B covering on sidewalls of the isolation structure 140, space for forming the metal gates 136A and 136B is enlarged even through the line-end distance D1 is very small. In various embodiments, the line-end distance D1 is in a range from about 10 nm to 30 nm. Besides, the barriers 134A and 134B are respectively disposed on the work function metals 132A and 132B and extended to cover and contact the sidewalls of the isolation structure 140. The barriers 134A and 134B covering on the sidewalls of the isolation structure 140 further avoid the metal residues and fluorine-based impurities migrating to the isolation structure 140, and thus enhances the insulating property of the isolation structure 140. In various embodiments, the isolation structure 140 includes silicon oxide, silicon nitride, spin-on glass, or combination thereof. In various embodiments, a thickness of the barriers 134A and 134B on the sidewalls of the isolation structure is in a range from about 0.5 nm to about 10.0 nm.

In FIG. 1A, the semiconductor structure 100 also includes a plurality of spacers 160. Each of the gate structures 130A and 130B is sandwiched between the two spacers 160. Besides, an interlayer dielectric (ILD) layer 170 is adjacent to the spacer 160 and covers the devices 120A and 120B of the semiconductor structure 100. Specifically, the ILD layer 170 and the gate structure 130A or 130B are on opposite sides of the spacer 160.

In some embodiments, the sidewall spacers 160 may include a dielectric material such as silicon oxide, silicon nitride, silicon carbide, silicon oxynitride, or combinations thereof. In various embodiments, the ILD layer 170 may include silicon oxide, silicon oxynitride, low k dielectric material or other suitable dielectric materials.

According to some embodiments, a process of manufacturing a semiconductor structure is provided. FIG. 2A to 2I are cross-sectional views of the semiconductor structure in FIG. 1A along the line AA at an intermediate stage of fabrication, in accordance with various embodiments. It worthy noting that the process is performed after removing a polysilicon gate and a gate oxide on the substrate 110, so as to replace the polysilicon gate and the gate oxide with a HK/MG stack. An etching process, such as selective wet etching process or selective dry etching process, is designed to have an adequate etch selectivity to remove the polysilicon gate and the gate oxide. In various embodiments, the etching process may include one or more etching steps with respective etchants.

Figure 2A:
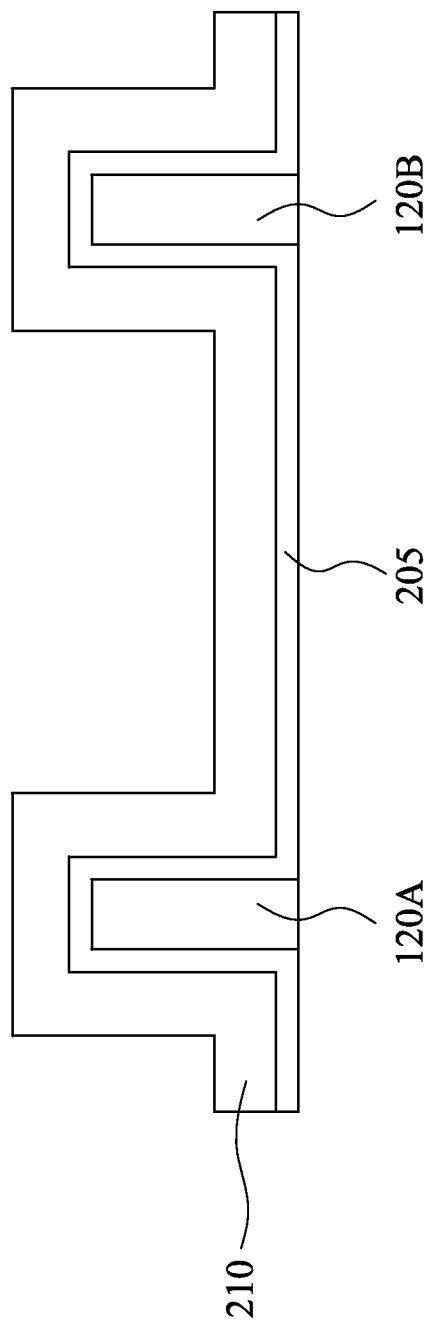

In FIG. 2A, a work function metal layer 210 is formed on the substrate 110. Specifically, the work function metal layer 210 is formed on the devices 120A and 120B. The work function metal layer 210 may includes an n-type work function metal, such as Ta, TiAl, TiAlN or TaCN, to produce suitable low threshold voltage for an n-type device. On the other hand, the work function metal layer 210 may includes a p-type work function metal, such as TiN or TaN, to produce suitable low threshold voltage for a p-type device. The work function metal layer 210 may be formed using ALD, PVD, CVD, combination thereof, or other suitable processes. In various embodiments, a high-k dielectric layer 205 is formed on the devices 120A and 120B before forming the work function metal layer 210. The high-k dielectric layer 205 may be formed by any suitable technique, such as ALD, CVD, metal-organic CVD (MOCVD), physical vapor deposition (PVD), other suitable technique, or a combination thereof. The high-k dielectric layer 205 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

Figure 2B:
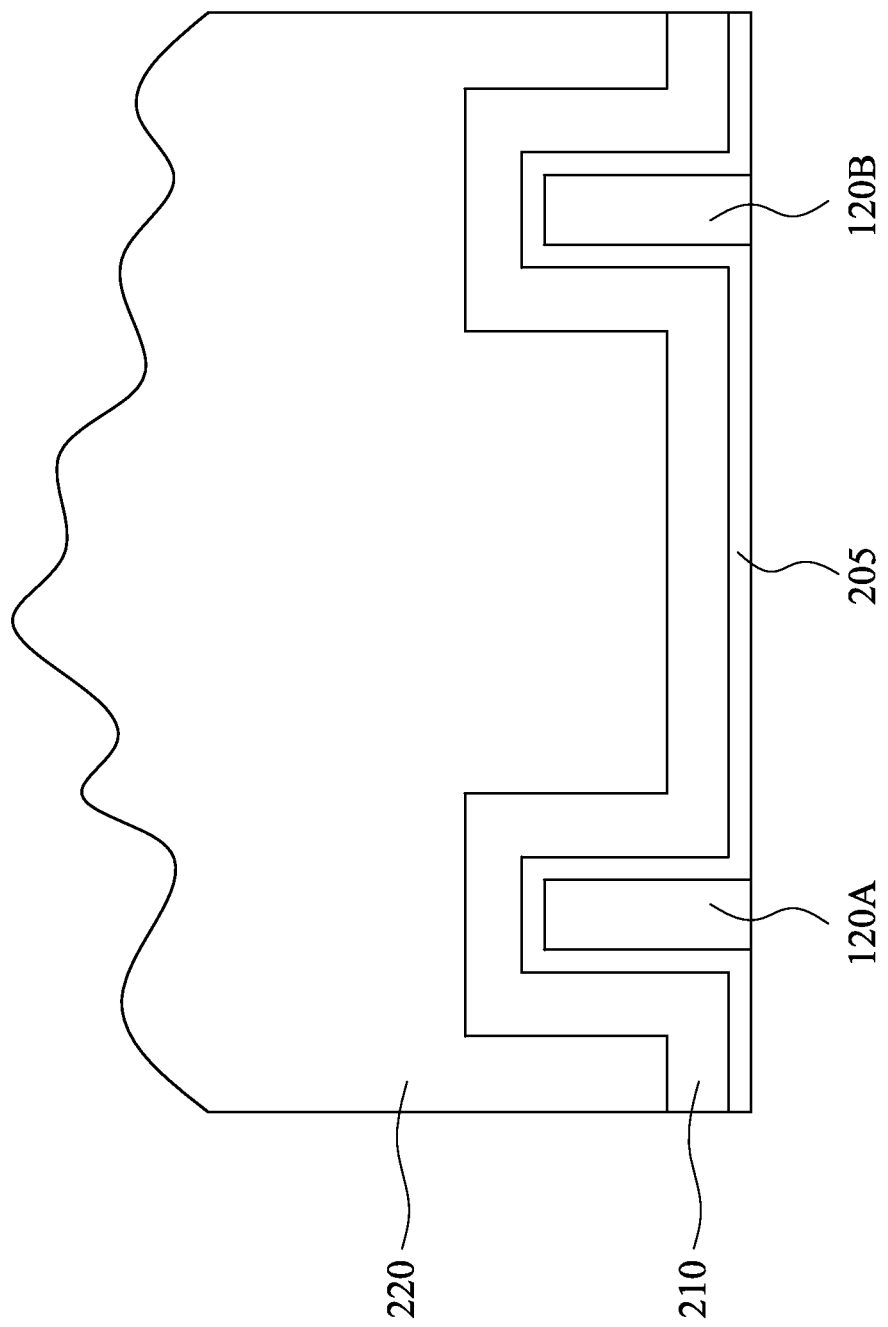

In FIG. 2B, a hardmask 220 is covered over the work function metal layer 210. The hardmask 220 may be formed by any suitable technique, such as ALD, PVD, CVD, other suitable technique, or a combination thereof. The hardmask 220 may include silicon, silicon oxide, silicon nitride, spin-on glass, or combination thereof. Besides, a chemical mechanical polishing (CMP) process is performed to planarize the top surface of the hardmask 220 to form an intermediate structure shown in FIG. 2C.

Figure 2D:
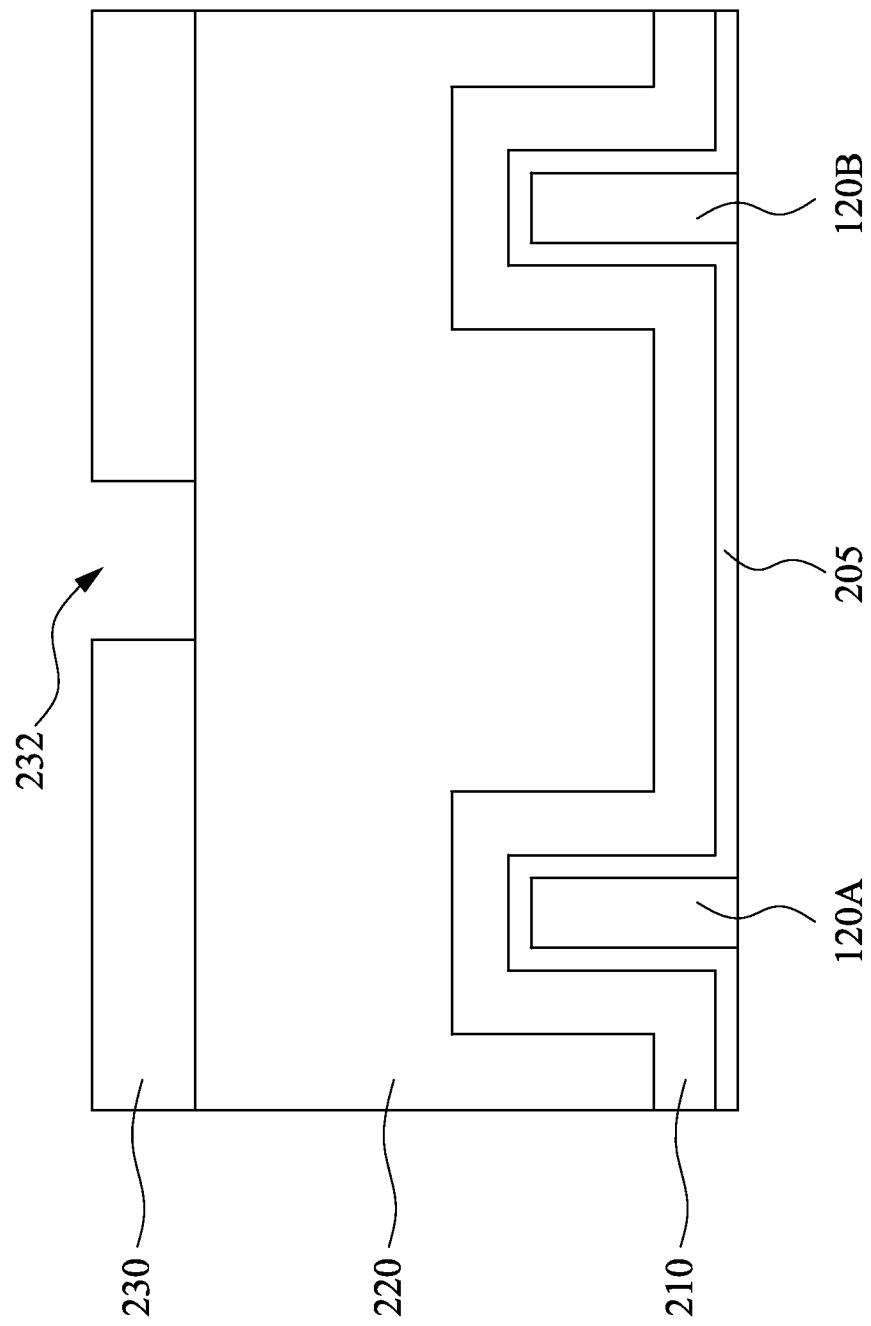

In FIG. 2D, a photoresist 230 is formed on the hardmask 220, and the photoresist 230 is patterned to form an opening 232 exposing a portion of the hardmask 220. Specifically, the opening is formed between the device 120A and 120B. The patterning process includes soft baking the photoresist 230, mask aligning, exposure, post-exposure baking, developing the photoresist to form the opening 232, rinsing, drying (e.g., hard baking), other suitable processes, and/or combinations thereof. In various embodiments, the photoresist 230 is formed on the hardmask 220 by spin-on coating.

Figure 2E:
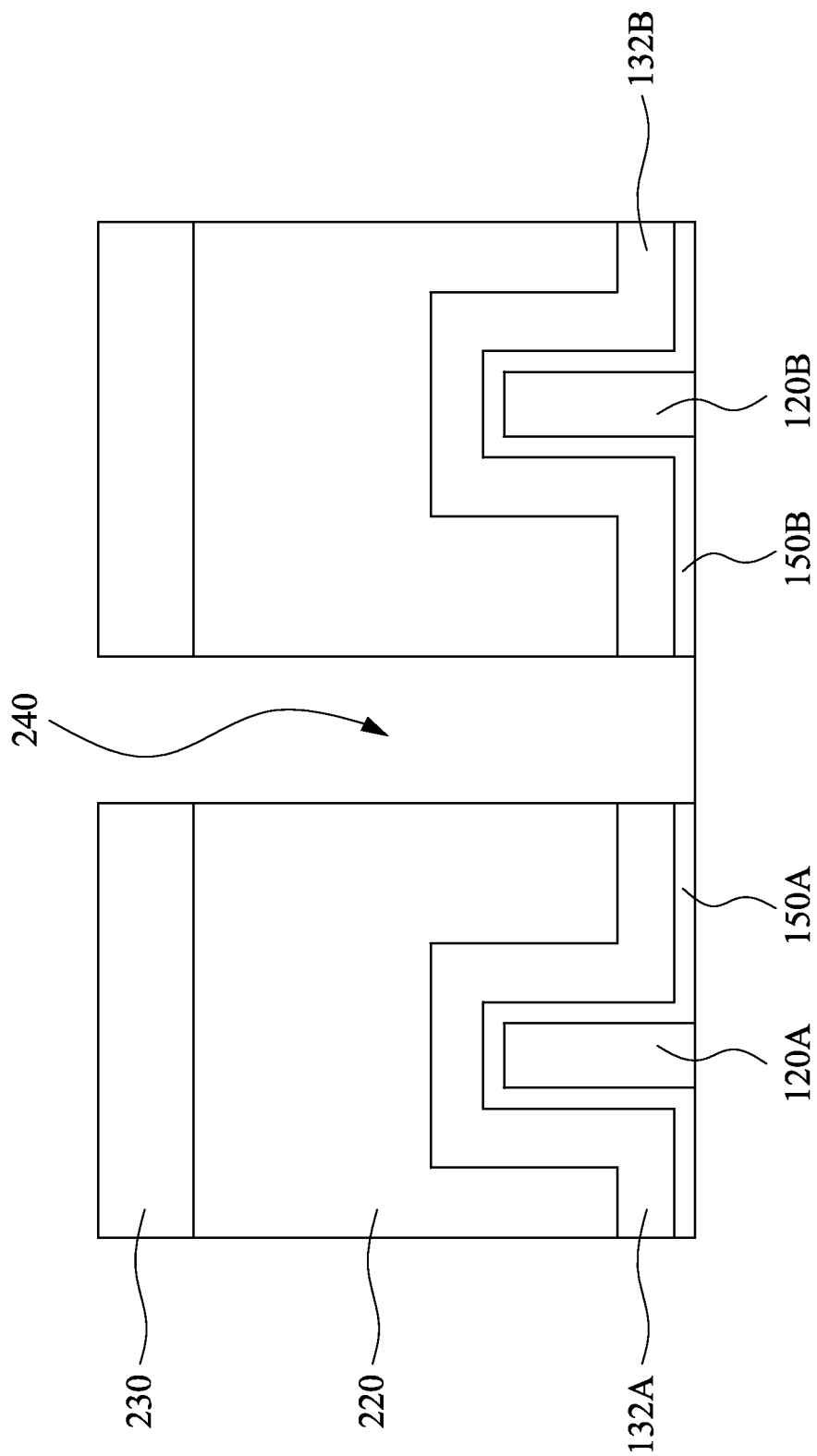

In FIG. 2E, a trench 240 is formed to penetrate the hardmask 220 and the work function metal layer 210. In addition, the trench 240 also penetrates the high-k dielectric layer 205. As shown in FIG. 2E, a portion of the hardmask 220 is removed through the opening 232, and the work function metal layer 210 below the hardmask 220 is exposed in the opening 232. Then, a portion of the work function metal layer 210 is removed through the opening 232 to expose the high-k dielectric layer 205 in the opening 232, and the high-k dielectric layer 150 exposed in the opening 232 is also removed. As such, the trench 240 is formed to penetrate the hardmask 220, the work function metal layer 210 and the high-k dielectric layer 205. In other words, the trench 240 is disposed between the device 120A and 120B to separate the hardmask 220, the work function metal layer 210 and the high-k dielectric layer 205. After forming the trench 240, the photoresist 230 is removed by suitable techniques, such as ashing. In great detail, the trench 240 separates the high-k dielectric layer 205 into two individual high-k dielectrics 150A and 150B respectively on the devices 120A and 120B. Also, the trench 240 separates the work function metal layer 210 into two individual work function metals 132A and 132B respectively on the high-k dielectrics 150A and 150B.

Typically, a trench is formed to penetrate a work function layer, a barrier layer and a metal gate layer. However, profile and size of the trench is difficult to be controlled when penetrating the metal gate layer, and an ILD layer adjacent to the trench is removed simultaneously. Compared with related approaches, profile of the trench 240 according to some embodiments is well controlled since the penetrating of the hardmask 220 is much easier than the penetrating of the metal gate layer. Therefore, a thickness of the ILD layer 170 adjacent to the trench 240 is not reduced when penetrating the hardmask 220, which prevents height loss of the metal gate when performing a CMP process.

In some embodiments, a trench 240 is formed using one or more etching processes. For example, a dry etching process using a plasma of HBr, $Cl_2$, $O_2$, $N_2$ or combination thereof is performed to selective etch the hardmask 220 and the work function metal layer 210, and a selective ratio of the hardmask 220 to the work function metal layer 210 is controlled in a range from about 100 to about 150. In various embodiments, a wet etching process using a solution of TMAH (tetramethylammonium hydroxide), $NH_4OH$, or combination thereof is performed to selective etch the work function metal layer 210 and the high-k dielectric layer 205, and a selective ratio of the work function metal layer 210 to the high-k dielectric layer 205 is controlled in a range from about 30 to about 50.

Figure 2F:
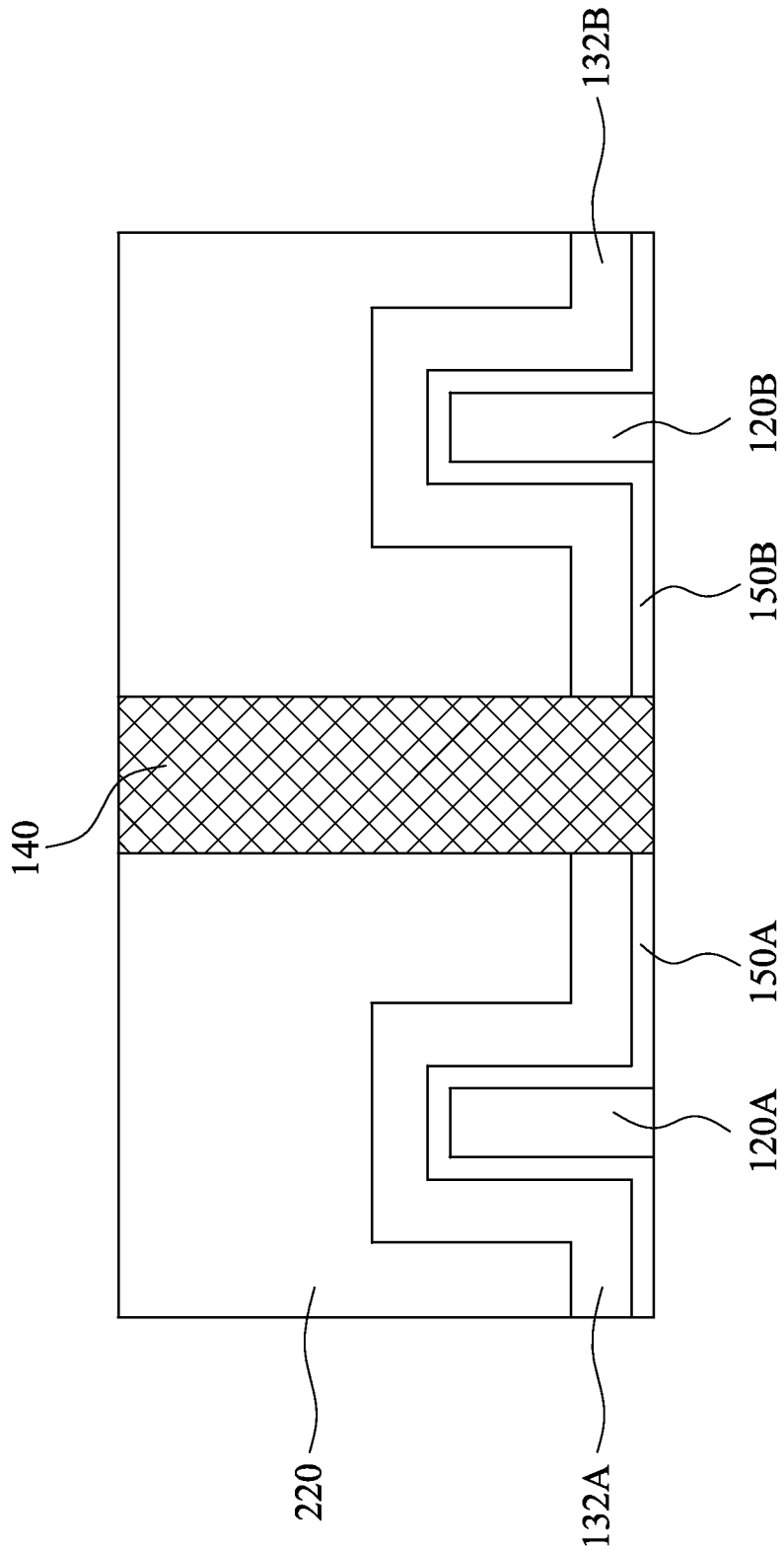

In FIG. 2F, the isolation structure 140 is filled in the trench 240. Because the isolation structure 140 is formed after forming the work function metal layer 210, the work function metals 132A and 132B do not cover sidewalls of the isolation structure 140. Therefore, it is not necessary to remove the unwanted work function metal on sidewalls of the isolation structure 140, which significantly reduces the complexity of the process. The isolation structure 140 is filled in the trench using flowable chemical vapor deposition (FCVD), and the material of the isolation structure 140 includes silicon oxide, silicon nitride, spin-on glass, other suitable materials, or a combination thereof. In various embodiments, a CMP process is performed to remove excess isolation structure 140 on the hardmask 220, and an annealing process is performed to the isolation structure 140 after the CMP process.

Figure 2G:
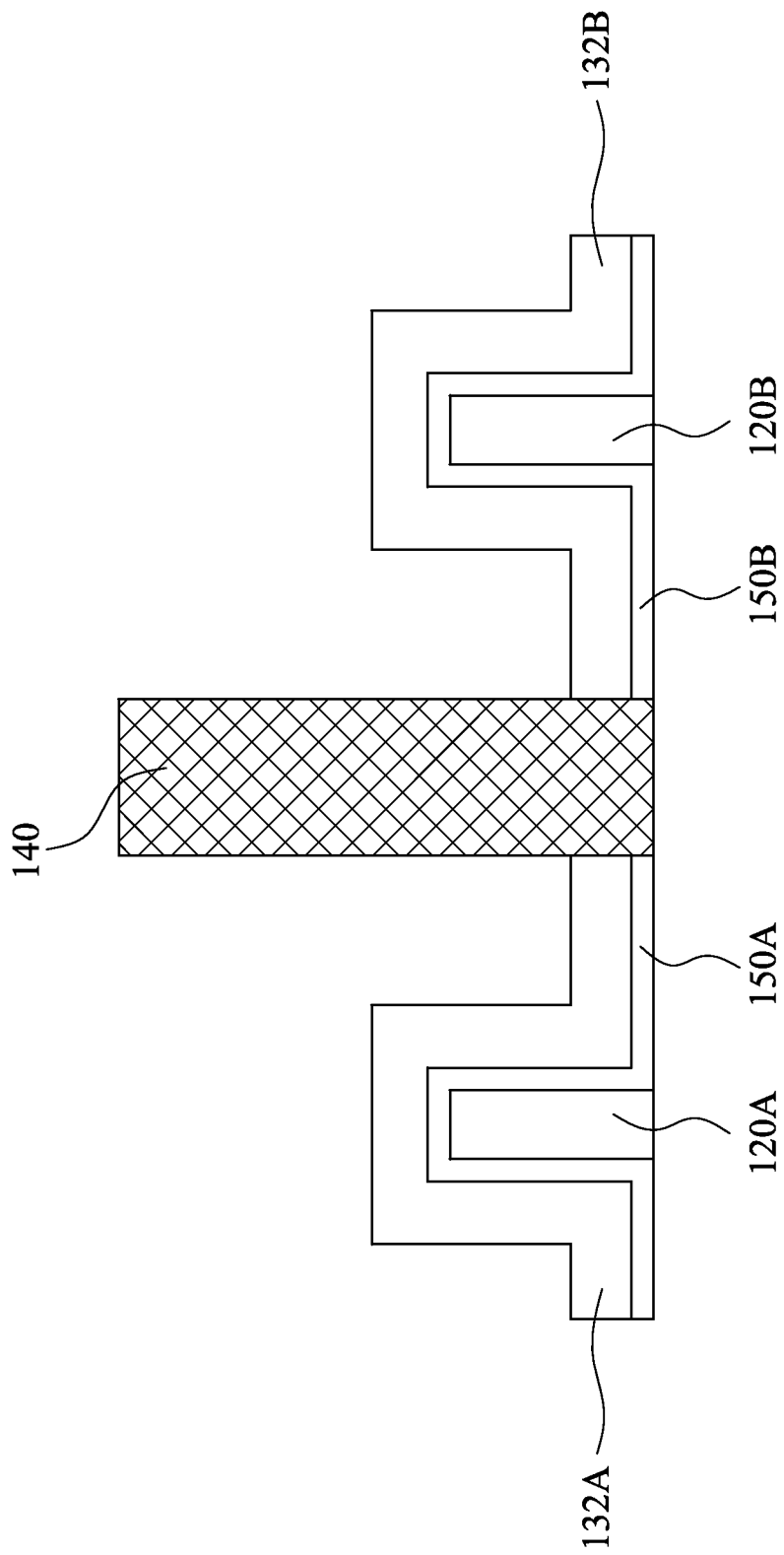

In FIG. 2G, the hardmask 220 is removed. After filling the isolation structure 140 in the trench 240, the hardmask 220 is removed to expose the work function metals 132A and 132B. In some embodiments, the hardmask 220 is removed by a wet etching process using a solution of $NH_4OH$.

Figure 2H:
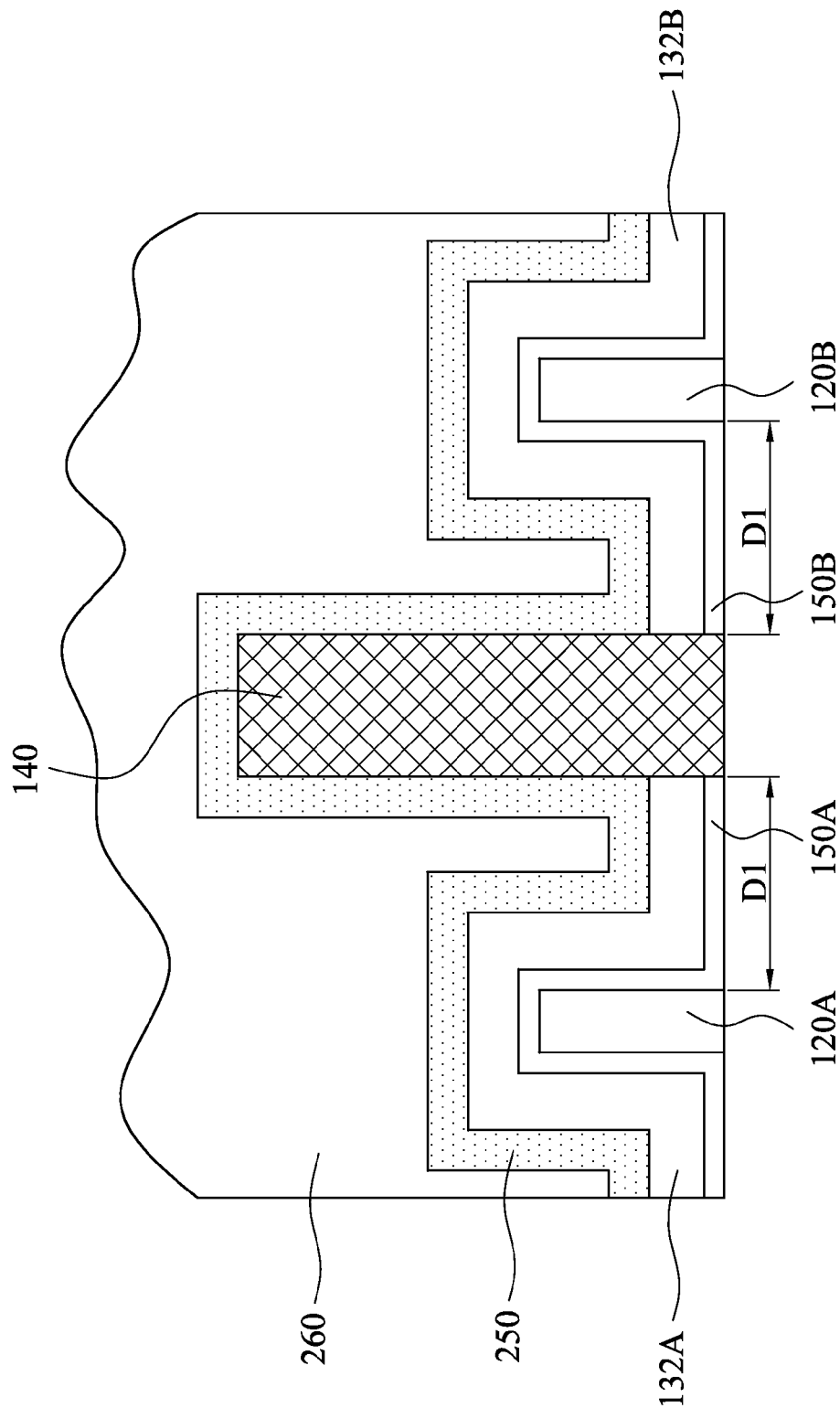

In FIG. 2H, a barrier layer 250 is covered over the work function metals 132A, 132B and the isolation structure 140, and a metal gate layer 260 is formed on the barrier layer 250. The barrier layer 250 is used to improve the adhesion between the metal gate layer 260 and the work function metals 132A and 132B. Also, the barrier layer 250 prevents metallic diffusion from the metal gate layer 260 into the device 120A and 120B. As shown in FIG. 2H, since the work function metals 132A and 132B do not cover the sidewalls of the isolation structure 140, the barrier layer 250 is formed to cover and contact the sidewalls and a top surface of the isolation structure 140. As such, the barrier layer 250 further avoids the metal residues and fluorine-based impurities in the metal gate layer 260 migrating to the isolation structure 140, and thus enhances the insulating property of the isolation structure 140. After covering the barrier layer 250 over the work function metals 132A and 132B, a metal gate layer 260 is formed on the barrier layer 250. Without the unwanted work function metal on the sidewalls of the isolation structure 140, the space for forming the metal gate layer 260 is enlarged even through the line-end distance D1 is very small, and thus increases overlapped area between the metal gate layer 260 and the devices 120A and 120B. In some embodiments, the line-end distance D1 is in a range from about 10 nm to 30 nm. In various embodiments, a thickness of the barriers 134A and 134B on the sidewalls of the isolation structure is in a range from about 0.5 nm to about 10.0 nm.

In various embodiments, the barrier layer 250 may include titanium nitride (TiN), tantalum nitride (TaN), tungsten nitride (WN), titanium carbon nitride (TiCN), tantalum carbon nitride (TaCN), tungsten carbon nitride (WCN), or combination thereof. The barrier layer 250 may be formed using any suitable technique, such as ALD, CVD, PVD, or a combination thereof. In various embodiments, the metal gate layer 260 may include aluminum, copper, titanium, tantalum, tungsten, molybdenum, platinum, or combination thereof. The metal gate layer 260 is formed using any suitable technique, such as sputtering, evaporating, electroplating, electroless plating, or a combination thereof.

In FIG. 2I, the metal gate layer 260 and the barrier layer 250 above the isolation structure 140 are removed. A CMP process is performed to remove the barrier layer 250 and the metal gate layer 260 on the isolation structure 140, and the CMP process stops at the top surface of the isolation structure 140. In other words, the CMP process separates the barrier layer 250 into individual barriers 134A and 134B respectively on the work function metals 132A and 132B. Also, the CMP process separates the metal gate layer 260 into individual metal gates 136A and 136B respectively on the barriers 134A and 134B. Therefore, two individual gate structures 130A and 130B are respectively formed on the devices 120A and 120B, and the isolation structure 140 electrically isolated the two gate structures 130A and 130B. Besides, the barriers 134A and 134B cover and contact the sidewalls of the isolation structure 140 to enhance the insulating property of the isolation structure 140.

Figure 3:
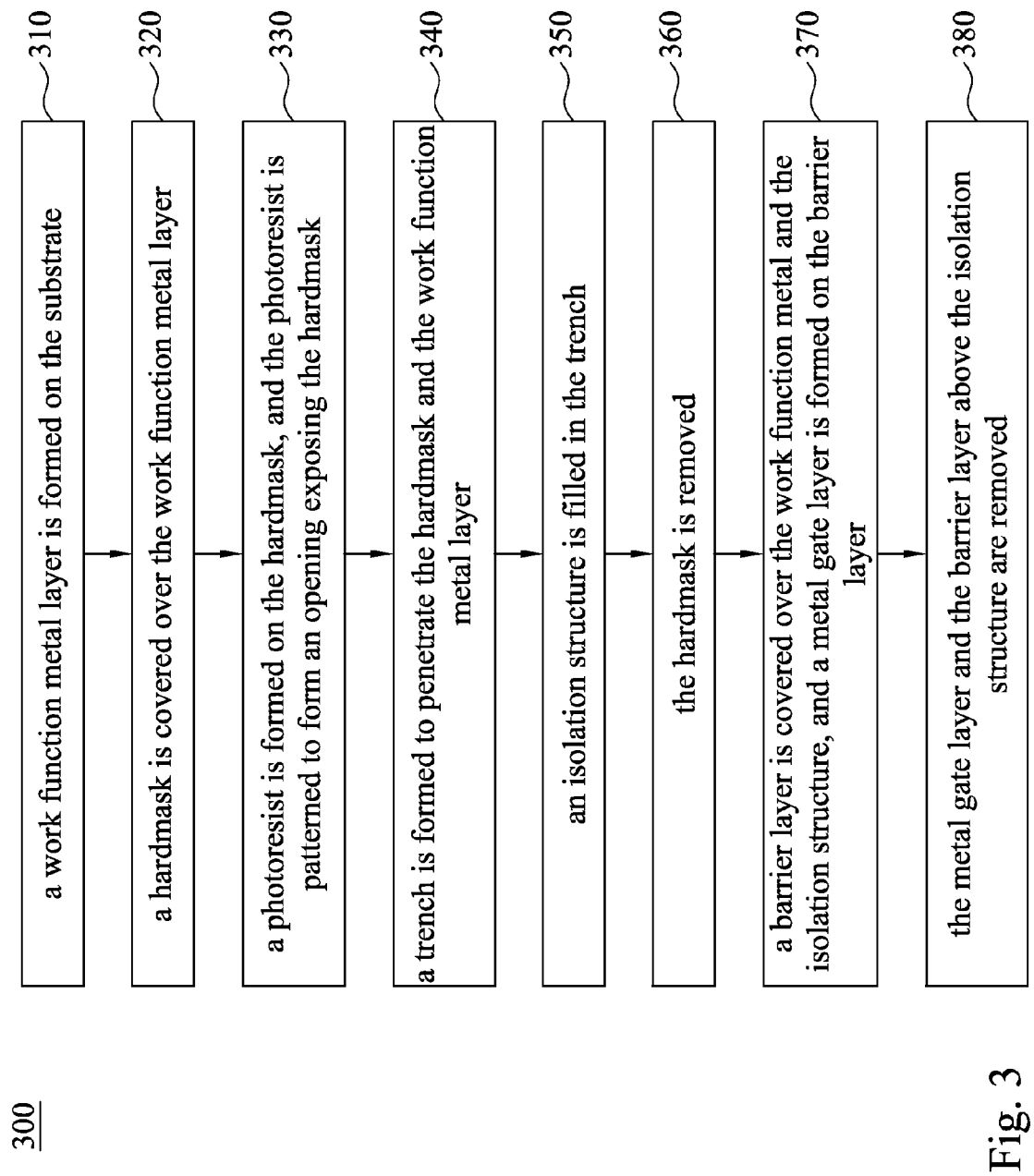
FIG. 3 is a flow chart of the process of manufacturing a semiconductor structure, in accordance with some embodiments.

FIG. 3 is a flow chart of the process of manufacturing a semiconductor structure, in accordance with some embodiments. The process 300 begins with block 310 in which a work function metal layer is formed on the substrate. The process 300 continues with block 320 in which a hardmask is covered over the work function metal layer. Continuing in block 330, a photoresist is formed on the hardmask, and the photoresist is patterned to form an opening exposing the hardmask. The process 300 continues with block 340 in which a trench is formed to penetrate the hardmask and the work function metal layer, and an isolation structure is filled in the trench as shown in block 350. In block 360, the hardmask is removed. Then, the process 300 continues in block 370 in which a barrier layer is covered over the work function metal and the isolation structure, and a metal gate layer is formed on the barrier layer. The process 300 continues with block 380 in which the metal gate layer and the barrier layer above the isolation structure are removed.

The embodiments of the present disclosure discussed above have advantages over existing processes and structures, and the advantages are summarized below. According to some embodiments, an improved process is provided to isolate adjacent gate structures. With forming the isolation structure after the formation of the work function metal, space for forming the metal gate on the work function metal is enlarged since there is no unwanted work function metal residues on sidewalls of the isolation structure. Besides, a barrier is directly formed on the sidewalls of the isolation structure to enhance the insulating property of the isolation structure.

On the other hand, profile and size of the trench is well controlled because the penetrating of the hardmask is much easier than the penetrating of the metal gate layer. Therefore, a thickness of the ILD layer adjacent to the trench will be maintained, which minimize the height loss of the metal gate when performing the subsequence CMP process. Summarize above points, an improved process is provided to isolate adjacent gate structures, so as to increase the performance of the semiconductor structure.

In accordance with some embodiments, the present disclosure discloses a process of manufacturing a semiconductor structure. The process begins with forming a work function metal layer on a substrate, and a hardmask is covered over the work function metal layer. A trench is formed to penetrate the hardmask and the work function metal layer, and an isolation structure is filled in the trench.

In accordance with various embodiments, the present disclosure discloses a of manufacturing a semiconductor structure. The process begins with forming a high-k dielectric layer on a substrate, and a work function metal layer is formed on the high-k dielectric layer. A hardmask is covered over the work function metal layer, and a trench is formed to separate the high-k dielectric layer, the hardmask and the work function metal layer. Then, an isolation structure is filled in the trench, and the hardmask is removed.

In accordance with various embodiments, the present disclosure discloses a semiconductor structure. The semiconductor structure includes a plurality of devices and a plurality of gate structures respectively disposed on the plurality of devices. Each of the gate structures includes a work function metal on the device, a barrier on the work function metal, and a metal gate on the barrier. An isolation layer separating the two adjacent ones of the gate structures, and the barrier is extended to cover and contact sidewalls of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process of manufacturing a semiconductor structure, the process comprising:
    forming a work function metal layer on a substrate;
    forming a hardmask layer over the work function metal layer;
    forming a trench penetrating the hardmask layer and the work function metal layer; and
    forming an isolation structure in the trench.

2. The process of claim 1, further comprising:
    removing the hardmask layer;
    forming a barrier layer over the work function metal layer and the isolation structure;
    forming a metal gate layer on the barrier layer; and
    removing the metal gate layer and the barrier layer above the isolation structure.

3. The process of claim 2, wherein the barrier layer covers and is in contact with sidewalls of the isolation structure.

4. The process of claim 2, wherein removing the hardmask layer is conducted by a wet etching process using a solution of $NH_4OH$.

5. The process of claim 2, wherein the barrier layer comprises tantalum, tantalum nitride, titanium nitride, tungsten nitride, titanium carbon nitride, tantalum carbon nitride, tungsten carbon nitride, or a combination thereof.

6. The process of claim 2, wherein the metal gate layer comprises aluminum, copper, titanium, tantalum, tungsten, molybdenum, platinum, or a combination thereof.

7. The process of claim 2, wherein removing the metal gate layer and the barrier layer above the isolation structure is conducted by a chemical mechanical polishing process.

8. The process of claim 2, wherein forming the barrier layer over the work function metal layer and the isolation structure comprises performing atomic layer deposition, chemical vapor deposition, physical vapor deposition, or a combination thereof.

9. A process of manufacturing a semiconductor structure, the process comprising:
forming a work function metal layer on a substrate;
forming a hardmask layer on the work function metal layer;
forming a trench through the hardmask layer and the work function metal layer; and
forming an isolation structure in the trench by filling the trench with dielectric material.

10. The process of claim 9, wherein the hardmask layer comprises silicon, silicon oxide, silicon nitride, spin-on glass, or a combination thereof.

11. The process of claim 9, wherein the forming the isolation structure comprises performing flowable chemical vapor deposition to fill the trench.

12. The process of claim 9, wherein the isolation structure comprises silicon oxide, silicon nitride, spin-on glass, or a combination thereof.

13. The process of claim 9, further comprising planarizing a top surface of the hardmask layer.

14. The process of claim 9, wherein the forming the work function metal layer on the substrate comprises performing atomic layer deposition, chemical vapor deposition, physical vapor deposition, or a combination thereof.

15. The process of claim 9, wherein the work function metal layer comprises n-type work function metal or p-type work function metal.

16. The process of claim 9, wherein the isolation structure comprises a single or plurality of layers.

17. A process of manufacturing a semiconductor structure, the process comprising:
receiving a substrate;
forming a work function metal layer over a gate region on the substrate;
forming a hardmask layer over the work function metal layer;
forming a trench pattern through the hardmask layer and the work function metal layer; and
forming an isolation structure in the trench pattern, thereby defining two isolated adjacent gate structures in the gate region.

18. The process of claim 17, further comprising:
removing the hardmask layer; and
forming isolated adjacent gate structures on each side of the isolation structure.

19. The process of claim 17, wherein forming isolated adjacent gate structures comprises:
forming a barrier layer substantially conformally over the work function metal layer and the isolation structure;
forming a metal gate layer on the barrier layer; and
removing the metal gate layer and the barrier layer above the isolation structure.

20. The process of claim 17, wherein forming the trench pattern comprises:
forming a photoresist layer on the hardmask layer;
patterning the photoresist layer to form an opening exposing the hardmask layer;
etching through the opening of the patterned photoresist layer to remove a portion of the hardmask layer; and
etching through the hardmask layer to remove a portion of the work function metal layer.

* * * * *